(12) United States Patent
Yoda

(10) Patent No.: US 8,917,751 B2
(45) Date of Patent: Dec. 23, 2014

(54) OPTICAL DEVICE

(71) Applicant: Citizen Holdings Co., Ltd., Tokyo (JP)

(72) Inventor: Kaoru Yoda, Nagano (JP)

(73) Assignee: Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/975,324

(22) Filed: Aug. 24, 2013

(65) Prior Publication Data

US 2014/0056323 A1    Feb. 27, 2014

(30) Foreign Application Priority Data

Aug. 27, 2012 (JP) ................. 2012-186612

(51) Int. Cl.
*H01S 5/00* (2006.01)
*H01S 5/022* (2006.01)
*H01S 5/02* (2006.01)

(52) U.S. Cl.
CPC ........... *H01S 5/0215* (2013.01); *H01S 5/02248* (2014.01); *H01S 5/021* (2013.01); *H01S 5/02256* (2013.01); *H01S 5/0092* (2013.01)
USPC ............ 372/50.1; 372/43.01; 372/22; 372/21

(58) Field of Classification Search
USPC .................... 372/50.1, 43.01, 22, 21
See application file for complete search history.

(56) References Cited

U.S. PATENT DOCUMENTS

2011/0073890 A1* 3/2011 Sugizaki et al. ............... 257/98
2011/0188532 A1* 8/2011 Hata et al. .................. 372/50.12

FOREIGN PATENT DOCUMENTS

JP    H06-338650 A    12/1994

\* cited by examiner

*Primary Examiner* — Kinam Park

(57) ABSTRACT

Provided is an optical device capable of bonding each optical part to a substrate with the same applied load by surface activated bonding even if the planar shape sizes of a plurality of optical parts to be mounted on the substrate are different from one another. The optical device includes a substrate, a plurality of optical parts different in planar shape size, bonded to the substrate by surface activated bonding adjacent to one another, and optically coupled with one another, and a plurality of bonding parts provided on the substrate in correspondence to the plurality of optical parts and including metallic micro bumps for bonding each optical part. The total area of the top surfaces of the micro bumps to be bonded to the corresponding optical part of each of the plurality of bonding parts is substantially the same.

6 Claims, 10 Drawing Sheets

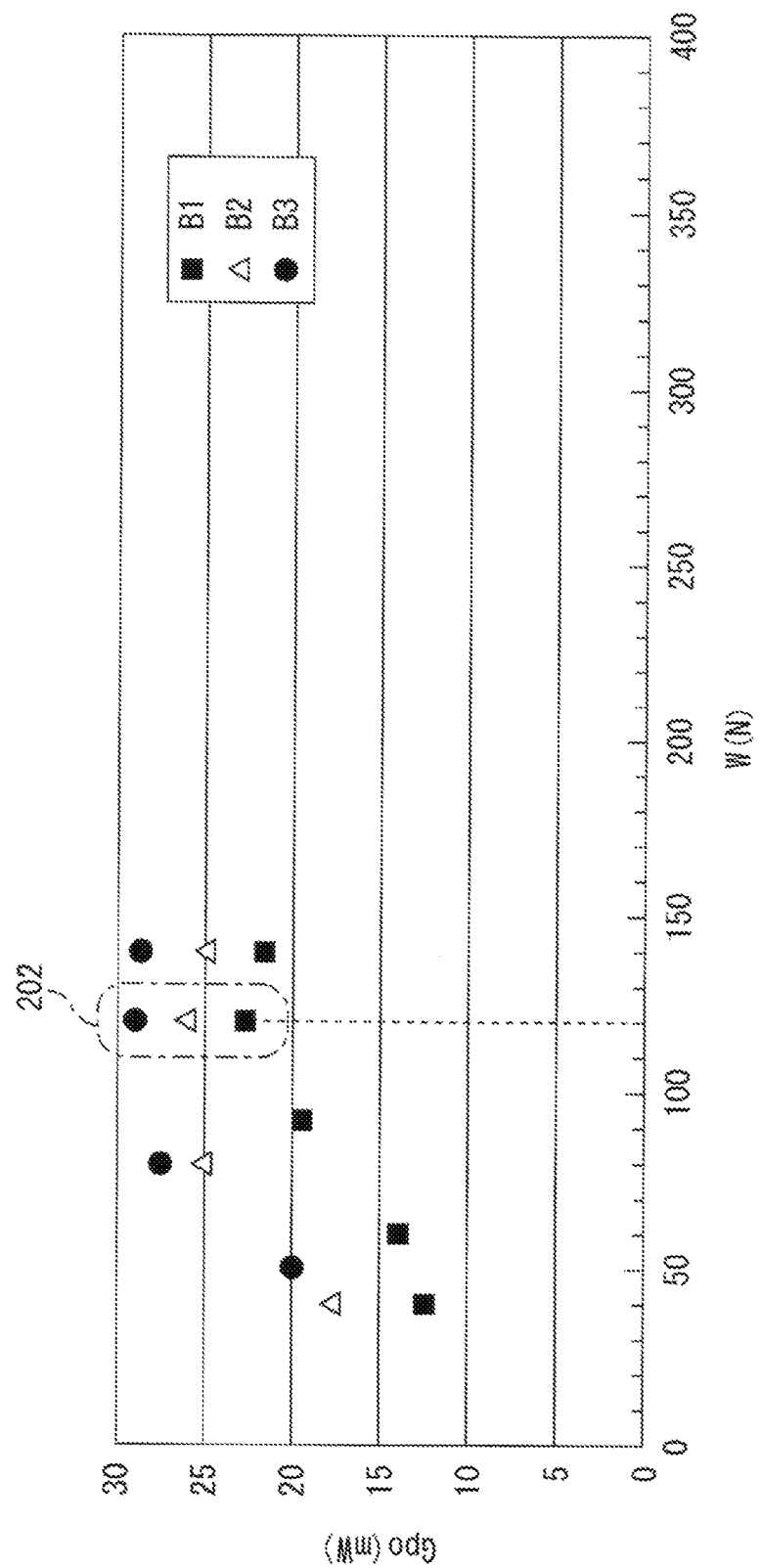

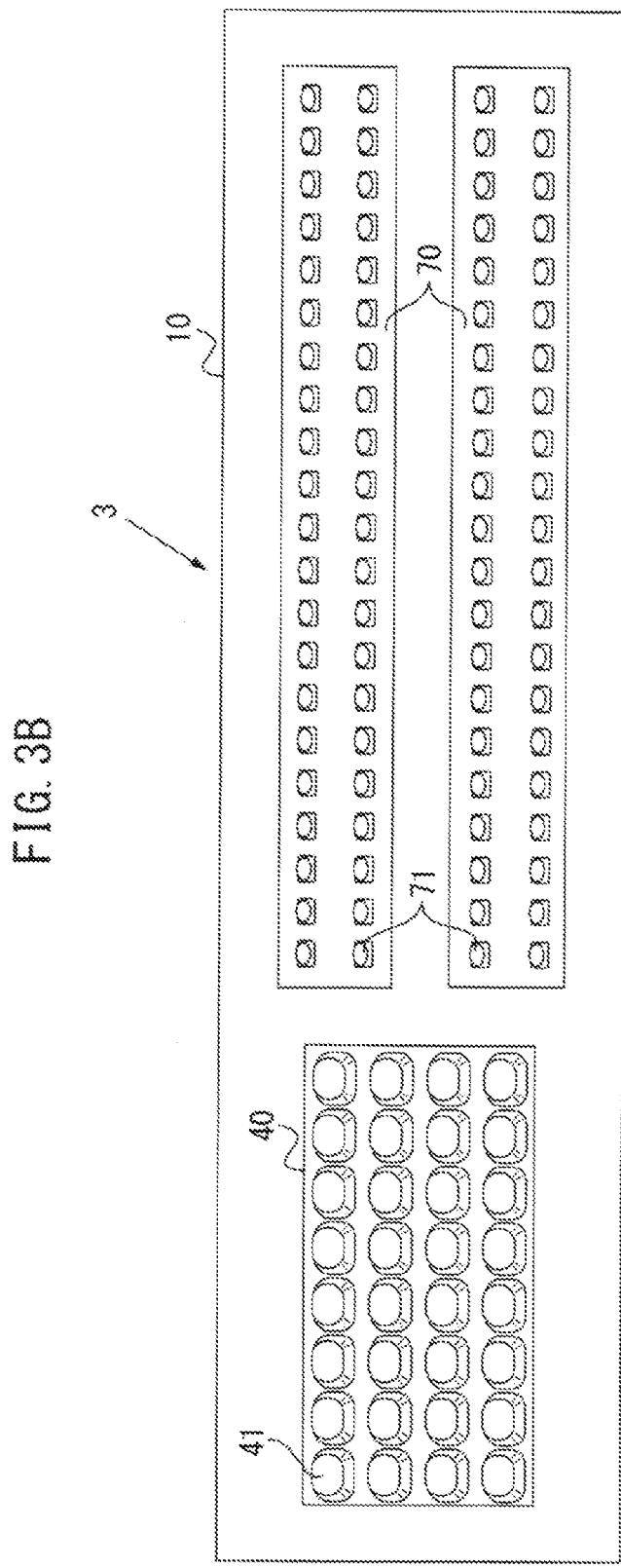

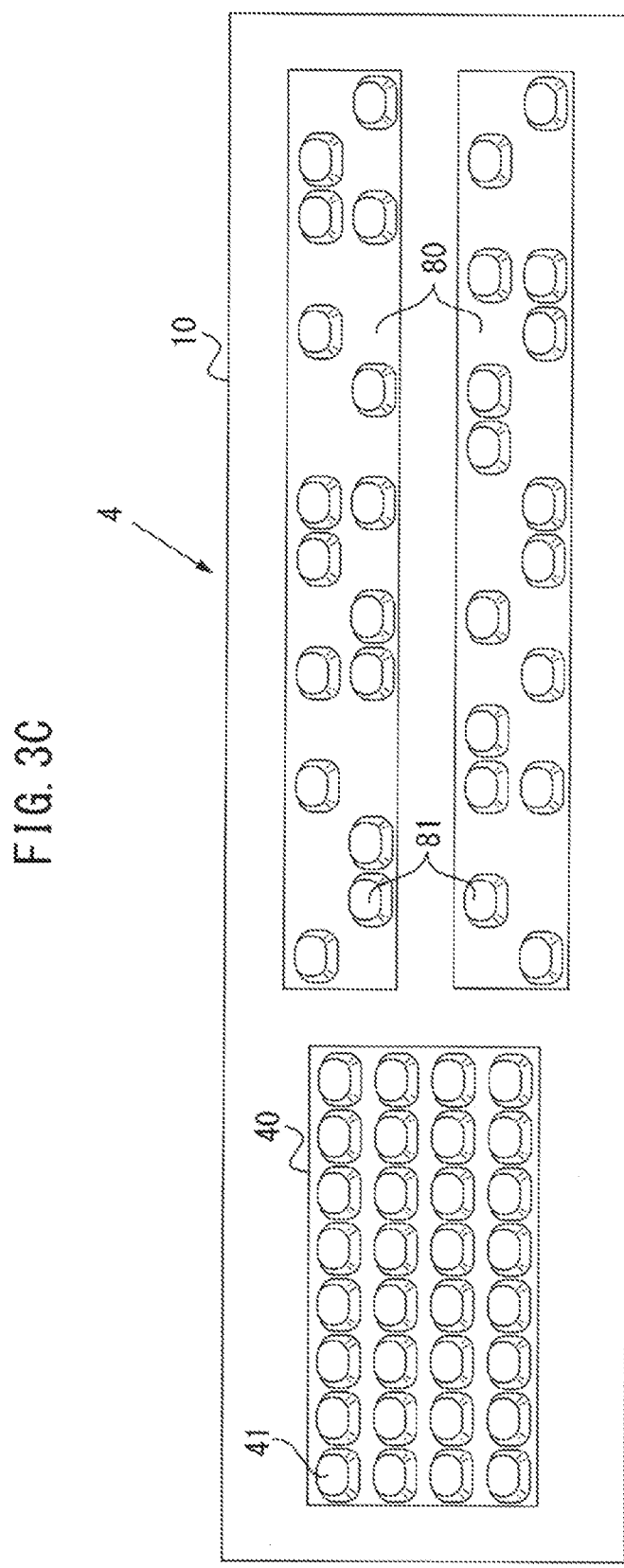

OPTICAL DEVICE

CROSS REFERENCE TO RELATED APPLICATION

This application is a new U.S. patent application that claims benefit of JP 2012-186612, filed on Aug. 27, 2012. The entire content of JP 2012-186612 is hereby incorporated by reference.

TECHNICAL FIELD

The present invention relates to an optical device in which a plurality of optical parts coupled optically with one another is mounted adjacent to one another on a single substrate.

BACKGROUND

A short wavelength laser light source, such as a blue light source and a green light source, is being developed in the field of laser projectors, high-density optical storage devices, etc. The short wavelength laser light source is a laser light source that employs a system referred to as SHG (Second Harmonic Generation). The SHG system short wavelength laser light source converts infrared light of the fundamental wave oscillated by a semiconductor laser into second harmonics by a wavelength conversion element and outputs blue or green laser light.

Regarding the SHG system short wavelength laser light source, an optical device is being developed, in which a laser light emitting element and a wavelength conversion element are mounted on a silicon substrate. Such an optical device is well known as disclosed in, for example, Japanese Unexamined Patent Publication No. H6-338650 (paragraph 0013, FIG. 12, etc.). The optical device is also referred to as an optical module.

FIG. 4 is an external appearance perspective view of a conventional optical device (SHG device) 1, which is an SHG system short wavelength laser light source.

The optical device 1 has a plate-shaped single silicon substrate 10, and a laser light emitting element 20 and a wavelength conversion element 30 as optical parts. The laser light emitting element 20 and the wavelength conversion element 30 are optically coupled to each other and mounted on the silicon substrate 10 adjacent to each other. Optical coupling means that the positional relationship is determined for each other so that light emitted from one of the optical parts can enter the other optical part directly.

The laser light emitting element 20 is a chip-type semiconductor laser configured to emit infrared light, etc. The wavelength conversion element 30 is rectangular in shape and has an optical waveguide 31 inside thereof as indicated by the broken line. The optical waveguide 31 contains, for example, LN (lithium niobate: $LiNbO_3$), which is a ferroelectric substance single crystal material, as its main component and to which MgO is added. The optical waveguide 31 is formed along the lengthwise direction at the center part of the wavelength conversion element 30.

When a drive current is supplied to the laser light emitting element 20 from outside, the optical device 1 emits infrared light L1, which is the fundamental wave. The infrared light L1 is input to the optical waveguide 31 of the wavelength conversion element 30 and converted into harmonics and green or blue laser light L2 is emitted. The laser light L2 emitted from the optical waveguide 31 of the wavelength conversion element 30 is transmitted to an external optical system by an optical fiber, etc., not illustrated schematically.

An outline of a method for mounting the laser light emitting element 20 and the wavelength conversion element 30, which are optical parts, on the single silicon substrate 10 when manufacturing such an optical device is explained by using FIG. 5 and FIG. 6.

FIG. 5 is an exploded perspective view of the optical device 1. FIG. 6 is a schematic longitudinal sectional view along VI-VI line in FIG. 4. However, for the silicon substrate 10, the laser light emitting element (LD) 20, and the wavelength conversion element (PPLN) 30, it is not necessary to illustrate their internal structures, and therefore, their sectional views are not illustrated.

As illustrated in FIG. 5, on the surface of the silicon substrate 10, bonding parts 40 and 50 for mounting the laser light emitting element 20 and the wavelength conversion element 30 are formed. As illustrated in FIG. 6, the bonding parts 40 and 50 have micro bump structures in which micro bumps (hereinafter, simply referred to as "bumps") 41 and 51, which are a large number of small metallic projections configured by a metal material, such as gold (Au), are provided at predetermined pitches. In FIG. 6, in order to make the micro bump structure of the bonding parts 40 and 50 easy-to-understand, the bumps 41 and 51 are exaggerated in size.

On the undersurfaces of the laser light emitting element 20 and the wavelength conversion element 30, for example, Au films 22 and 32 are formed as metal films in the shape of a belt at the portions in opposition to the bonding parts 40 and 50, respectively, as illustrated in FIG. 6. However, the Au films 22 and 32 are not illustrated in FIG. 5.

The laser light emitting element 20 is arranged in a predetermined position on the bonding part 40 and pressure is applied thereto. Due to this, the laser light emitting element 20 is bonded to the silicon substrate 10 by surface activated bonding. Similarly, the wavelength conversion element 30 is arranged in a predetermined position on the bonding part 50 and pressure is applied thereto. Due to this, the wavelength conversion element 30 is bonded to the silicon substrate 10 by surface activated bonding. In this example, the bonding part 50 is formed as two parallel patterns not passing through the portion of the optical waveguide 31 illustrated in FIG. 4.

In more detail, the bumps 41 and 51 of the bonding parts 40 and 50 and the Au films 22 and 32 are cleaned by argon plasma before bonding and their surfaces are activated, respectively. Then, the laser light emitting element 20 and the wavelength conversion element 30 are adsorbed individually by a pressure tool, not illustrated schematically, and mounted on the bonding part 40 or the bonding part 50 of the silicon substrate 10. Then, a load (pressure load) is applied at normal temperature without heating. Consequently, the top surfaces of the bumps 41 of the bonding part 40 and the Au film 22 on the undersurface of the laser light emitting element 20, and the top surfaces of the bumps 51 of the bonding part 50 and the Au film 32 on the undersurface of the wavelength conversion element 30 come into contact with each other, respectively. Because of this, the bumps 41 and 51 are crushed slightly and surface activated bonding is performed. By the surface activated bonding, metal atoms and molecules of the bumps 41 and 51 of the bonding parts 40 and 50 and the metal atoms and molecules in the vicinity of the bonding surfaces of the Au films 22 and 32 are diffused toward the opposite sides and firm diffusion bonding is performed.

In the optical device such as this, if the positional relationship between the laser light emitting element 20 and the wavelength conversion element 30 optically coupled with each other are not adjusted with high precision, the optical coupling is not sufficient and it is no longer possible to input the infrared light L1 from the laser light emitting element 20 to the optical waveguide 31 of the wavelength conversion element 30 efficiently. Consequently, in order to obtain laser light with high output power, the center adjustment of the axis of emitted light of the laser light emitting element 20 and the axis of incident light of the wavelength conversion element 30 is very important.

Further, the wavelength conversion element 30 has the shape of a long plate, and therefore, if unwanted stress is applied when it is mounted onto the silicon substrate 10, the wavelength conversion element 30 is easily bent. If the wavelength conversion element 30 is bent, the optical waveguide 31 inside thereof is also bent, and as a result, transmission loss of the incident infrared light L1 increases and it is no longer possible for the wavelength conversion element 30 to function sufficiently.

SUMMARY

In the conventional optical device such as this, as illustrated in FIG. 6, in the bonding parts 40 and 50 for boding the laser light emitting element 20 and the wavelength conversion element 30 having a planar shape larger than that of the laser light emitting element 20 to the silicon substrate 10, respectively, a large number of the bumps 41 and 51 having the same diameter are formed at predetermined pitches. For example, in both the bonding parts 40 and 50, the bumps having a diameter ($\phi$) of 5 μm are formed at 10 μm pitches. Consequently, in the bonding parts 40 and 50, the area of the top surface of each of the bumps 41 and 51 before bonding is the same and the area of the top surface of each of the bumps 41 and 51 after boding (also referred to as an area of bonding) is also the same. The total area of the top surfaces (total value of the area of bonding) per unit area of the bumps 41 in the bonding part 40 is also substantially the same as that of the bumps 51 in the bonding part 50.

Because of this, it is necessary to increase the load applied when bonding the wavelength conversion element 30, which is an optical part having a large planar shape, to the silicon substrate 10 compared to the load applied when bonding the laser light emitting element 20, which is an optical part having a small planar shape, to the silicon substrate 10.

In the example illustrated in FIG. 6, the number of bumps in the bonding part 40 for bonding the laser light emitting element 20 is 8 (16 in the case of two rows). In contrast to this, the number of bumps in the bonding part 50 for bonding the wavelength conversion element 30 is 21 (42 in the case of two rows).

Consequently, the ratio of the total value of area of bonding of each bump between the bonding part 40 and the bonding part 50 is 8:21. Because of this, it is necessary to increase a load W2 applied when bonding the wavelength conversion element 30 so as to be 21/8≈2.6 times a load W1 applied when bonding the laser light emitting element 20.

Consequently, the center adjustment in the Z direction (applied load direction) illustrated in FIG. 6 is also performed under a high load. In this case, the applied load with which the coupling efficiency takes a peak after the center adjustment fluctuates for each wavelength conversion element, and therefore, it is no longer possible to perform the center adjustment efficiently.

If a high load is applied when bonding the wavelength conversion element 30 to the silicon substrate 10, the elongated wavelength conversion element 30 is bent by its stress and the internal optical waveguide 31 may also be bent. In this case, the transmission loss of incident light increases and there is a possibility that the function of wavelength conversion cannot be fulfilled sufficiently.

Further, in the optical device 1, it is necessary to adsorb the laser light emitting element 20 and the wavelength conversion element 30 individually with a pressure tool, to mount them on the bonding part 40 or the bonding part 50 of the silicon substrate 10, and to apply loads different from each other. Because of this, the efficiency of the mounting work of the optical parts is low.

An object of the present invention is to provide an optical device capable of bonding each optical part to a substrate with the same applied load by surface activated bonding even if the planar shape sizes of a plurality of optical parts to be mounted on the substrate are different from one another.

The optical device includes a substrate, a plurality of optical parts different in planar shape size, bonded to the substrate by surface activated bonding adjacent to one another, and optically coupled with one another, and a plurality of bonding parts provided on the substrate in correspondence to the plurality of optical parts and including metallic micro bumps for bonding each optical part, wherein the total area of the top surfaces of the micro bumps to be bonded to the corresponding optical part of each of the plurality of bonding parts is substantially the same.

Preferably, in the optical device, each of the plurality of bonding parts differs in density of the micro bumps in accordance with the size of the planar shape of the corresponding optical part.

Preferably, in the optical device, each of the plurality of boding parts has substantially the same area of the top surface of each micro bump and differs in the pitch of the micro bumps.

Preferably, in the optical device, each of the plurality of boding parts has substantially the same pitch of the micro bumps and differs in the area of the top surface of each micro bump.

Preferably, in the optical device, the plurality of optical parts is mounted on the same plane of the substrate.

Preferably, in the optical device, the plurality of optical parts is a laser light emitting element and a wavelength conversion element.

In the optical device according to the present invention, it is possible to bond each optical part to the substrate with the same applied load by surface activated bonding even if the planar shape sizes of a plurality of optical parts to be mounted on the substrate are different from one another. Because of this, it is possible to simultaneously adsorb a plurality of optical parts with a common pressure tool, to mount them on each bonding part of the substrate, and to simultaneously bond them. Consequently, it is possible to perform the mounting work of optical parts efficiently. The mutual position relationship of neighboring optical parts is also maintained, and therefore, the center adjustment work is not necessary as the case may be. Even when the center adjustment is performed, it is possible to easily perform the center adjustment with a low load. Further, when bonding an elongated optical part, such as a wavelength conversion element, onto the substrate, it is not necessary to apply a high load, and therefore, it is also possible to prevent an increase in the transmission loss of light caused by bending of an optical part.

BRIEF DESCRIPTION OF THE DRAWINGS

Other features and advantages of the present optical device will be apparent from the ensuing description, taken in conjunction with the accompanying drawings, in which:

FIG. 2A and FIG. 2B are plot diagrams illustrating experimental results for comparing the difficulties of the center adjustment work by a conventional optical device 1 and by the optical device 2 of the present invention;

FIG. 3B is a top view of the silicon substrate 10 of the optical device 3;

FIG. 3C is a top view of the silicon substrate 10 of an optical device 4;

DESCRIPTION

Hereinafter, with reference to the drawings, an optical device according to the present invention is explained in detail. However, it should be noted that the technical scope of the present invention is not limited to embodiments and includes the invention described in claims and equivalents thereof. The same symbols are attached to the same or corresponding elements and duplicated explanation is omitted.

Figure 1A:
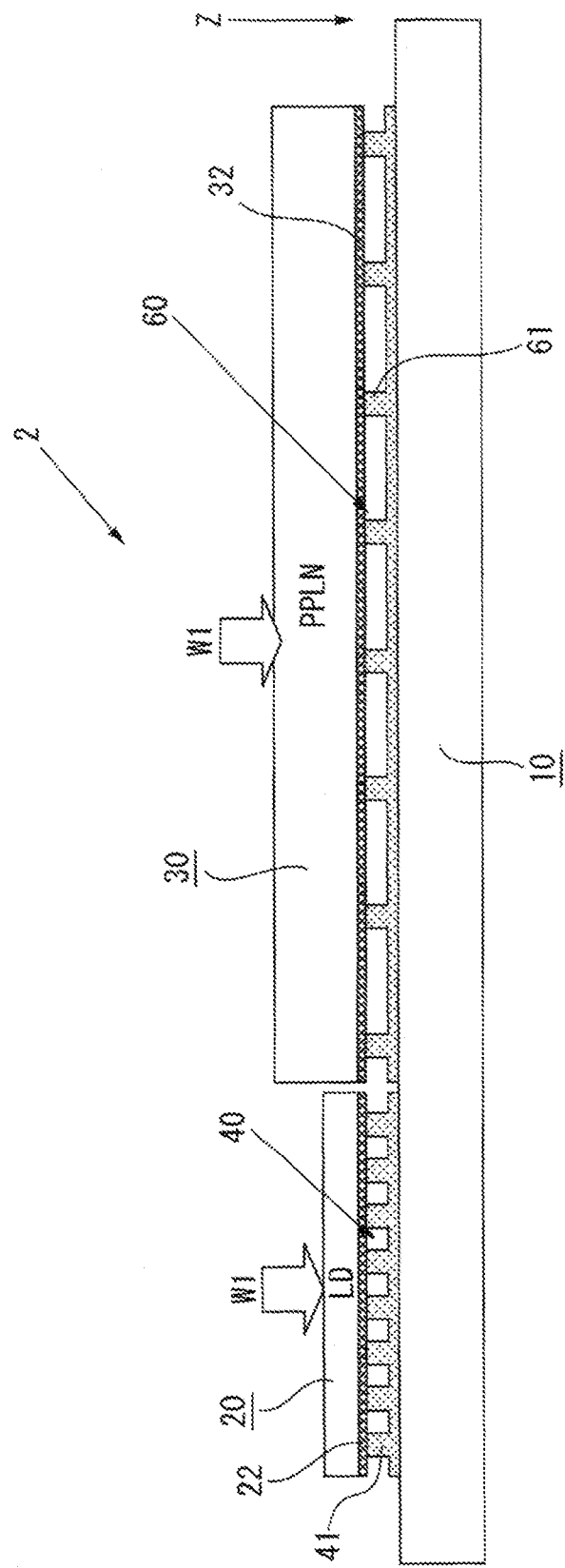
FIG. 1A is a schematic longitudinal sectional view of an optical device 2.

FIG. 1A is a schematic longitudinal sectional view of an optical device 2. FIG. 1A corresponds to FIG. 6, which is a schematic longitudinal sectional view along VI-VI line in FIG. 4.

Figure 4:
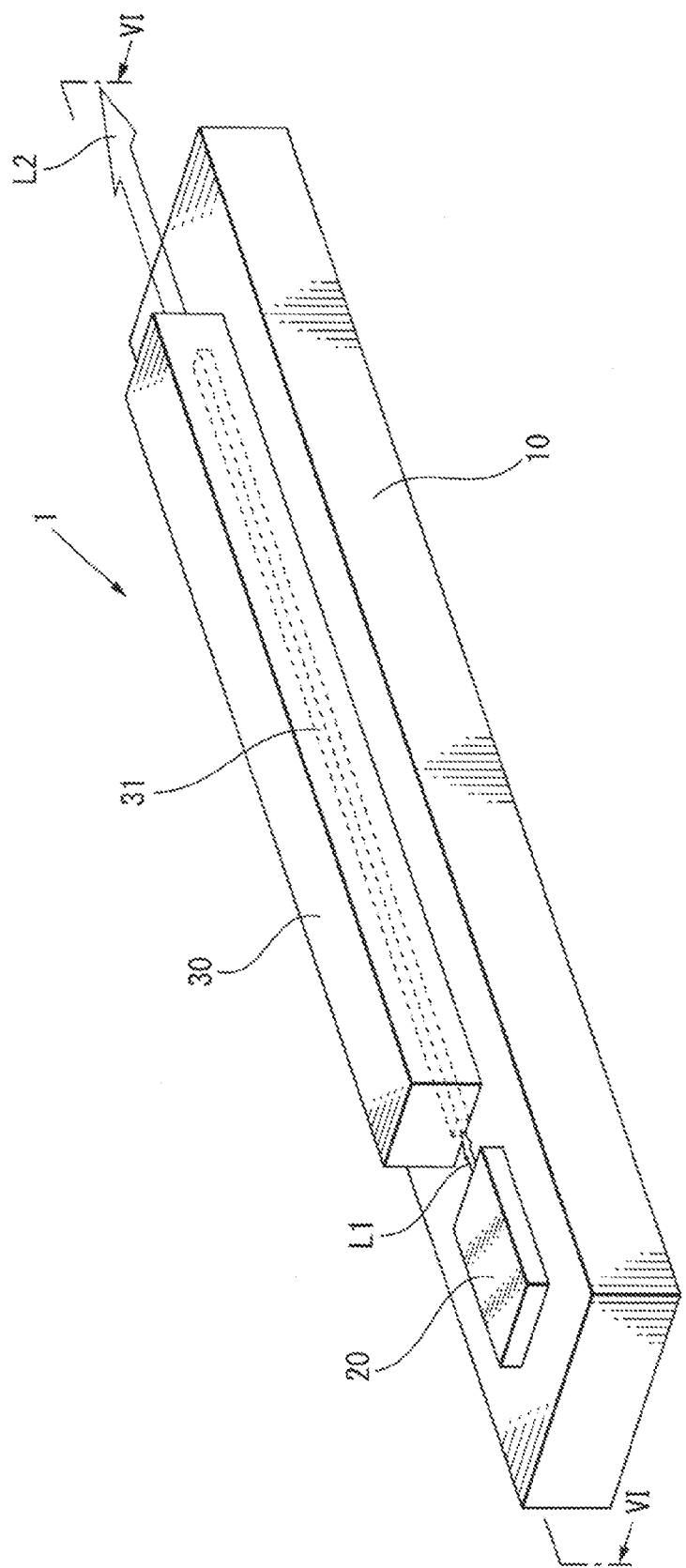
FIG. 4 is an external appearance perspective view of the conventional optical device 1.
Figure 5:
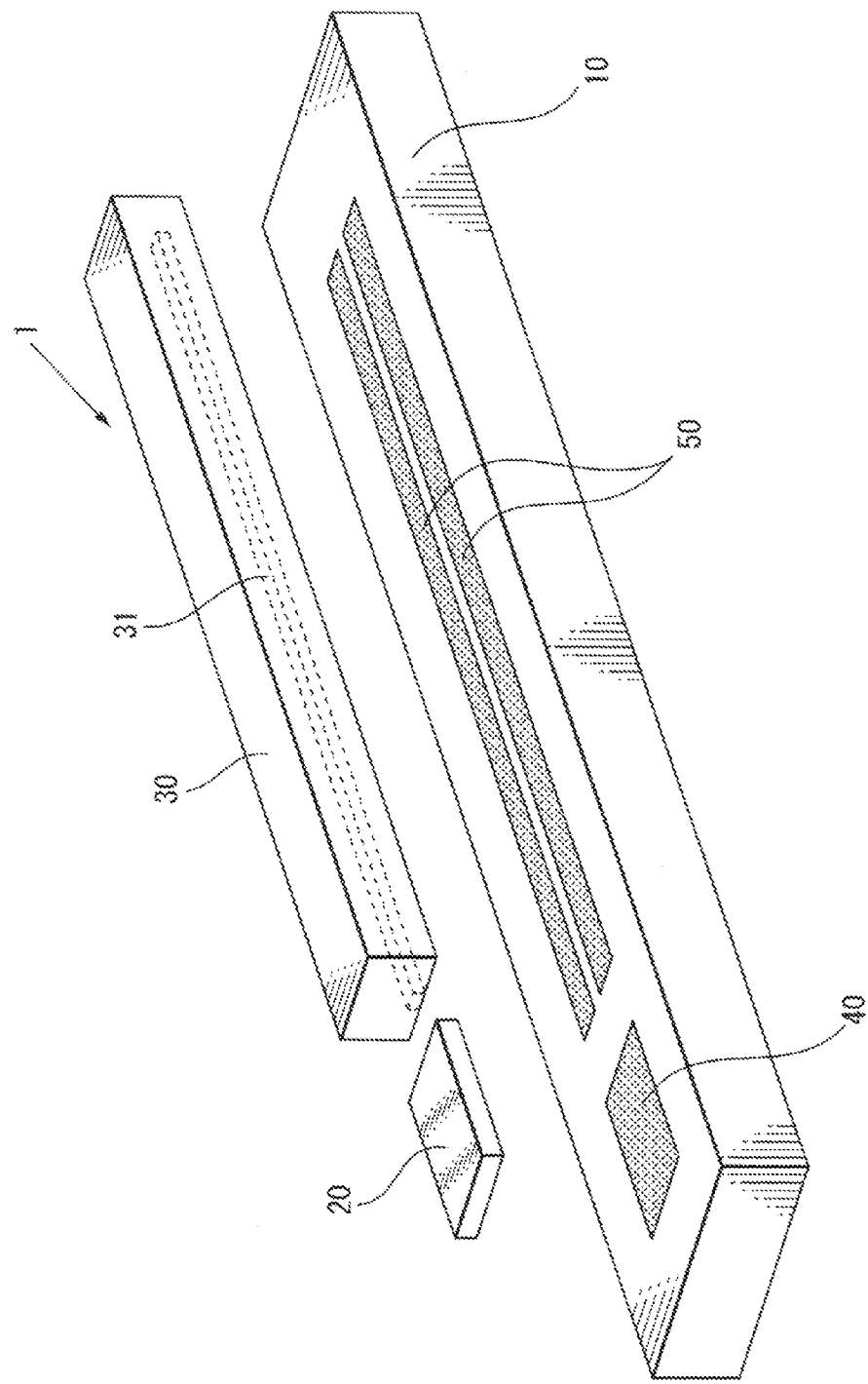
FIG. 5 is an exploded perspective view of the optical device 1.

The external appearance of the optical device 2 is the same as that of a conventional optical device 1 illustrated in FIG. 4 and FIG. 5. The optical device 2 illustrated in FIG. 1A also has a silicon substrate 10, which is a plate-shaped single substrate, and a laser light emitting element (LD) 20 and a wavelength conversion element (PPLN) 30, which are optical parts. The laser light emitting element 20 and the wavelength conversion element 30 are optically coupled with each other and mounted on the silicon substrate 10 adjacent to each other.

Figure 6:
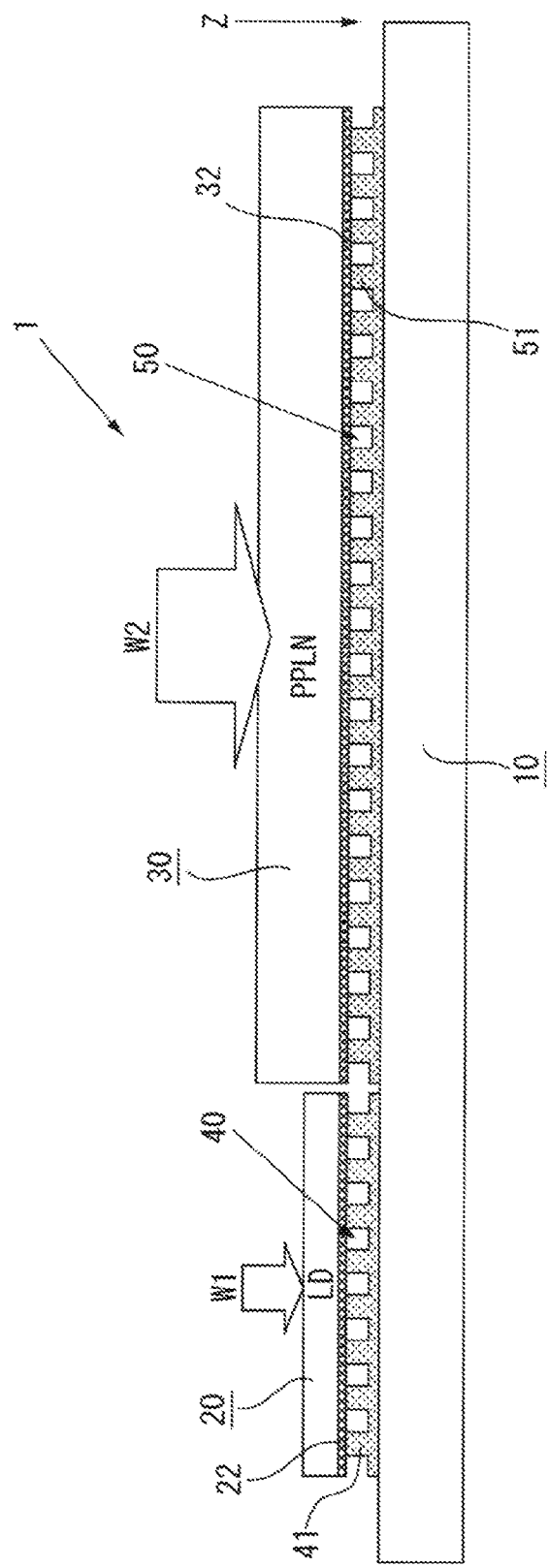
FIG. 6 is a schematic longitudinal sectional view along VI-VI line in FIG. 4.

As in the optical device 1 illustrated in FIG. 6, on the surface of the silicon substrate 10, bonding parts 40 and 60 for bonding the laser light emitting element 20 and the wavelength conversion element 30 are formed. Each of the bonding parts 40 and 60 also has a micro bump structure in which bumps 41 and 61, which are a large number of small metallic projections (micro bumps) configured by a metal material, such as gold (Au), are provided at predetermined pitches. In FIG. 1A also, in order to make the micro bump structure of the bonding parts 40 and 60 easy-to-understand, the bumps 41 and 61 are exaggerated in size.

At portions in opposition to at least the bonding parts 40 and 60 on the undersurfaces of the laser light emitting element 20 and the wavelength conversion element 30, as metal films, for example, Au films 22 and 32 are formed in the shape of a belt. Then, the laser light emitting element 20 and the wavelength conversion element 30 are bonded to the silicon substrate 10 by surface activated bonding by the bonding parts 40 and 60 of the micro bump structure configured by a metal material and the Au films 22 and 32, respectively.

The bonding part 60 is formed as two parallel patterns not passing through the portion of an optical waveguide 31 illustrated in FIG. 4. The bonding part 40 is also formed as two parallel patterns along the vicinity of both end parts in the width direction. The optical device 2 illustrated in FIG. 1A differs from the optical device 1 illustrated in FIG. 6 only in the bonding part 60 for bonding the wavelength conversion element 30 to the silicon substrate 10.

Figure 1B:
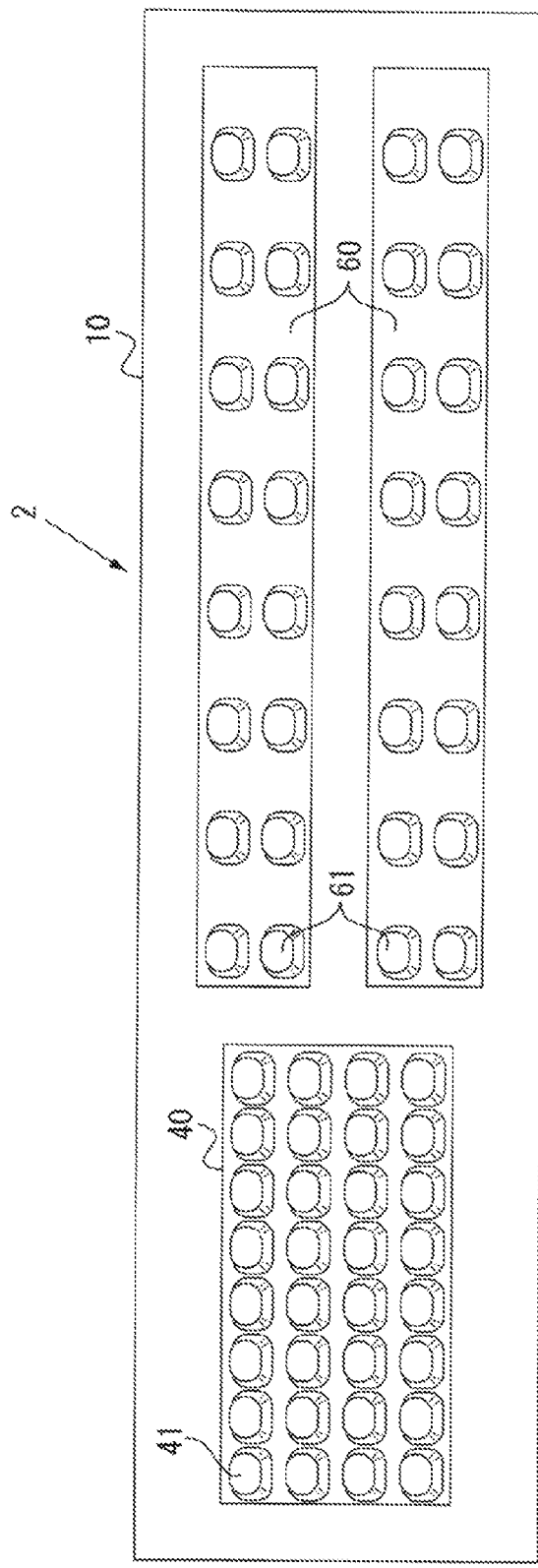
FIG. 1B is a top view of a silicon substrate 10 of the optical device 2.

FIG. 1B is a top view of the silicon substrate 10 of the optical device 2.

The top surface of each of the bumps 41 and 61 has a circular planar shape having a diameter ($\phi$) of, for example, 5 μm, and has the same area. However, while the bumps 41 of the bonding part 40 and the bumps 51 of the bonding part 50 are formed at the same pitch, for example, 10 μm pitch, in the optical device 1 in FIG. 6, the bumps 41 of the bonding part 40 and the bumps 51 of the bonding part 50 are formed at different pitches in the optical device 2 as illustrated in FIG. 1A and FIG. 1B. Specifically, the pitch of the bumps 41 of the bonding part 40 is 10 μm, the same as that in the optical device 1, however, the pitch of the bumps 61 of the bonding part 60 is 25 μm, greater than that of the bumps 41.

Because of this, in the optical device 2, the number of the bumps 41 of the bonding part 40 and the number of the bumps 61 of the bonding part 60 are the same. In FIG. 1A, the bumps 41 and 61 are exaggerated in size and the number in one row is 8, respectively (16 in the case of two rows). In actuality, the number of the bumps 41 and 61 is by far larger, however, in the optical device 2, the total number of the bumps 41 and the total number of the bumps 61 are made substantially the same. Consequently, before bonding, the total area of the top surface of each bump 41 in the bonding part 40 for bonding the laser light emitting element 20 is substantially the same as the total area of the top surface of each bump 61 in the bonding part 60 for bonding the wavelength conversion element 30 whose planar shape is larger than that of the laser light emitting element 20. Because of this, after bonding also, the total value of the area of bonding of the bumps 41 is substantially the same as the total value of the area of bonding of the bumps 61.

Consequently, when mounting the laser light emitting element 20 and the wavelength conversion element 30 on the silicon substrate 10 adjacent to each other, it is also possible to reduce a load applied to the wavelength conversion element 30 as low as a load W1 applied to the laser light emitting element 20. The applied load (applied pressure) is in proportion to the total value of the area of bonding of the bumps in each of the bonding parts 40 and 60, and therefore, if the total values thereof are substantially the same, the applied loads are also substantially the same. In this case also, the load applied to one bump 61 in the bonding part 60 is the same as that in the case of the optical device 1 illustrated in FIG. 6. Because of this, surface activated bonding of each bump 61 and the Au film 32 is performed securely.

Consequently, in the optical device 2, it is possible to simultaneously bond the laser light emitting element 20 and the wavelength conversion element 30 by adsorbing them with a common pressure tool, mounting them on the bonding parts 40 and 60 of the silicon substrate 10, and applying the same load W1. Due to this, the efficiency of mounting work is improved considerably.

It is not necessary for the total values of the area of bonding of these bumps to be strictly the same between neighboring elements. In a range in which both elements can be bonded securely when the same load is applied, a corresponding tolerance may be accepted.

If it is possible to simultaneously mount the laser light emitting element 20 and the wavelength conversion element 30 on the silicon substrate 10 as described above, the pressure jig can be simplified. At this time, since the amount of crush of the bumps of each part is substantially the same, the initial center adjustment in the height direction (Z direction) is no longer necessary. Even in the case where the center adjustment in the Z axis is performed, it is possible to considerably reduce the center adjustment load than before. Because of this, the control of center adjustment load is facilitated and it is easy to search for a value with which the coupling efficiency takes a peak. Further, there are almost no variations in the applied load with which the coupling efficiency takes a peak between each wavelength conversion element. Consequently, the center adjustment process can be simplified, it is possible to perform the center adjustment efficiently, and it is possible to easily obtain high output power laser light.

Figure 2A:
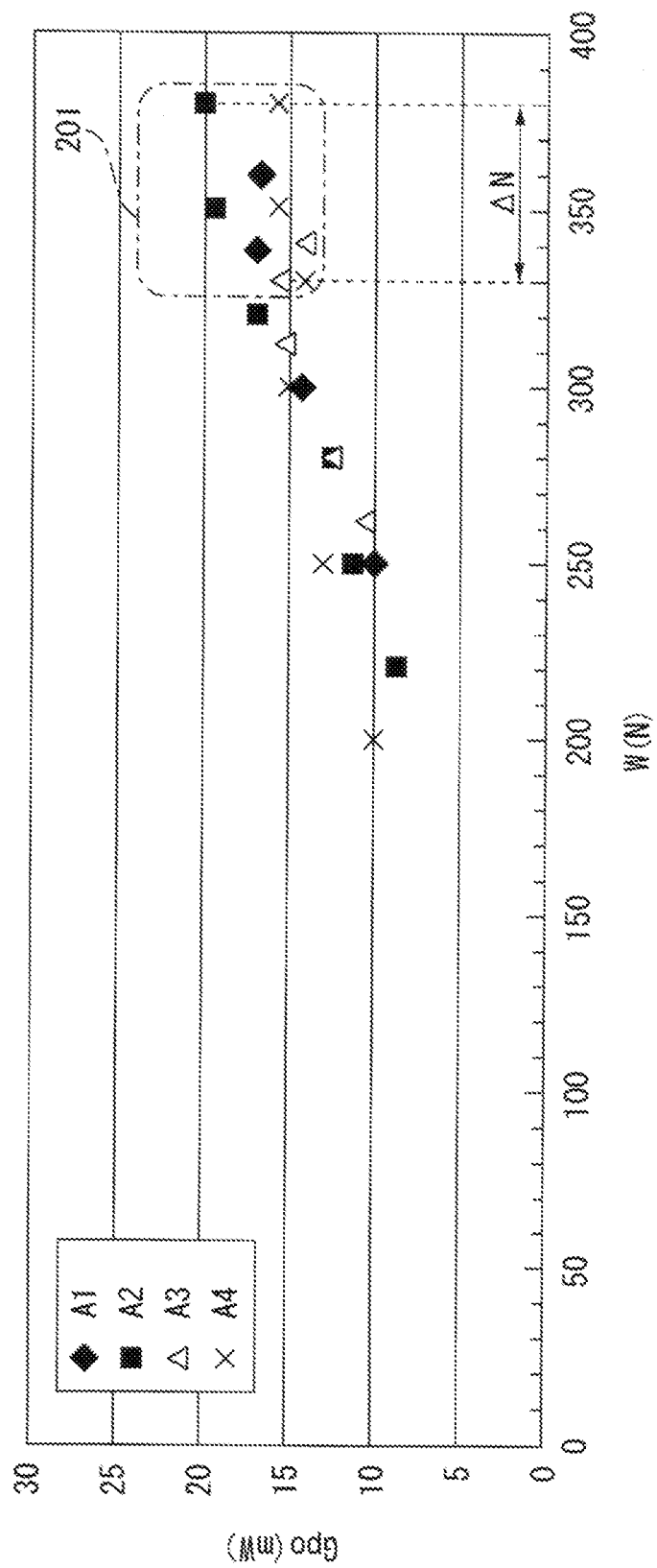

FIG. 2A and FIG. 2B are plot diagrams indicating the experimental results for comparing the difficulties of the center adjustment by the conventional optical device 1 and by the optical device 2 of the present invention.

FIG. 2A is a diagram indicating a relationship between a load W (N: Newton) applied to the wavelength conversion element 30 when the center adjustment in the Z direction is performed for four samples A1 to A4 of the optical device 1 illustrated in FIG. 6 and an amount of laser light Gpo (mW) emitted from the wavelength conversion element 30. In each of the samples A1 to A4, the laser light emitting element 20 and the wavelength conversion element 30 are bonded to the silicon substrate 10, respectively, at the bonding parts 40 and 50 formed by bumps having a diameter of 5 μm and arranged at 10 μm pitches.

FIG. 2B is a diagram indicating a relationship between the load W (N) applied to the wavelength conversion element 30 when the center adjustment in the Z direction is performed for three samples B1 to B3 of the optical device 2 illustrated in FIG. 1A and the amount of laser light Gpo (mW) emitted from the wavelength conversion element 30. In each of the samples B1 to B3, the laser light emitting element 20 and the wavelength conversion element 30 are bonded to the silicon substrate 10, respectively, at the bonding part 40 formed by bumps having a diameter of 5 μm and arranged at 10 μm pitches and at the bonding part 60 formed by bumps having a diameter of 5 μm and arranged at 25 μm pitches.

As is known from FIG. 2A, the optical device 1 requires a high applied load of 330 N to 380 N to obtain a peak 201 of Gpo (peak of coupling efficiency) and further, there are variations in a range of about 50 N (ΔN) depending on samples.

In contrast to this, as is known from FIG. 2B, in the case of the optical device 2, a peak 202 of Gpo is obtained by an applied load of 120 N, a low load nearly ⅓ of the conventional one, and there are almost no variations. Consequently, with the optical device 2, it is possible to perform the center adjustment in the Z direction both efficiently and easily with a low load.

Further, in the optical device 2, the applied load required when the wavelength conversion element 30 is bonded to the silicon substrate 10 is a small load as the load applied to the laser light emitting element 20. Because of this, it is possible that the wavelength conversion element 30 is no longer bent by its stress and the transmission loss of incident light will not increase because the internal optical waveguide is unlikely to be bent, and therefore, it is possible to perform wavelength conversion efficiently.

Figure 3A:
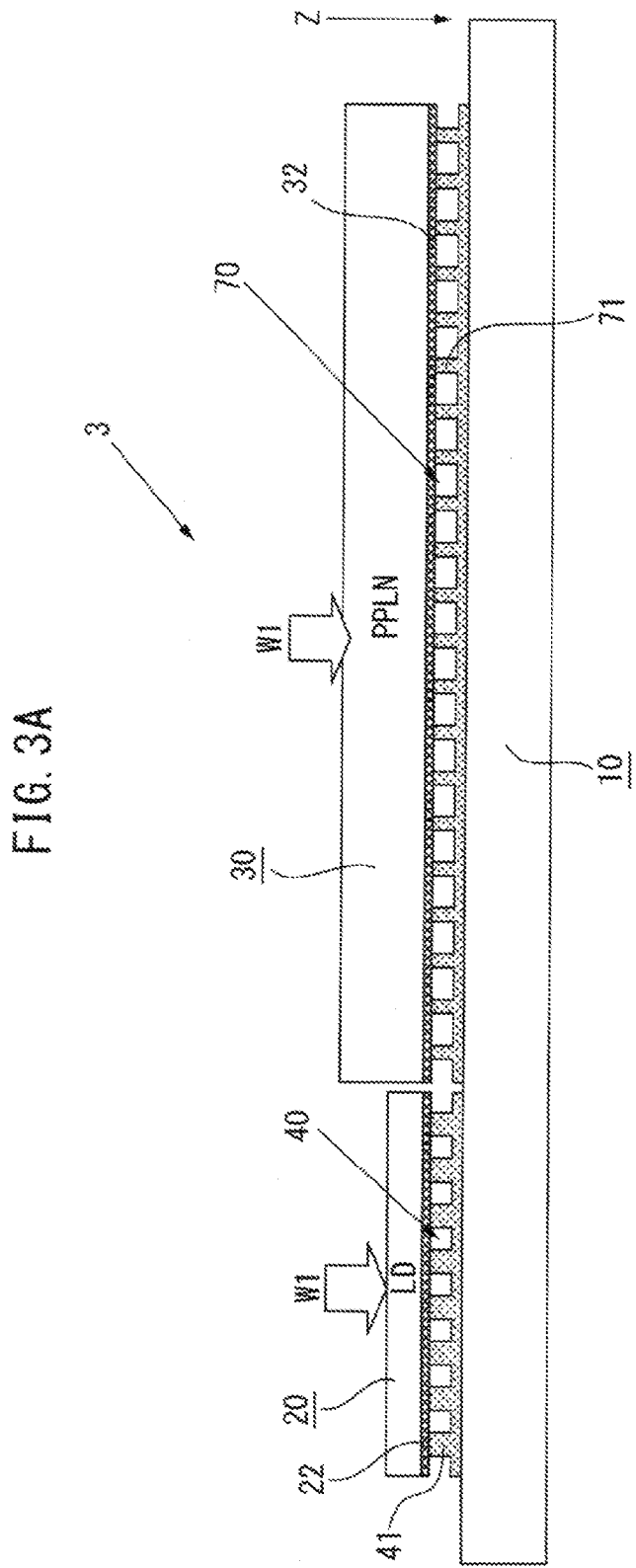
FIG. 3A is a schematic longitudinal sectional view of an optical device 3.

FIG. 3A is a schematic longitudinal sectional view of an optical device 3.

The external appearance of the optical device 3 is similar to those of the optical device 2 illustrated in FIG. 1A and the optical device 1 illustrated in FIG. 6. The optical device 3 illustrated in FIG. 3A differs from the optical device 2 illustrated in FIG. 1A only in bonding parts 70 for bonding the wavelength conversion element 30 to the silicon substrate 10.

FIG. 3B is a top view of the silicon substrate 10 of the optical device 3.

At the bonding part 70, as in the optical device 1 illustrated in FIG. 6, bumps 71 are formed at 10 μm pitches, the same as those of the bumps 41 of the bonding part 40 for bonding the laser light emitting element 20. However, before bonding, the diameter (φ) of each bump 71 is reduced to √(8/21) times the diameter of each bump 41 so that the area of the top surface of each bump 71 is 8/21 of the area of the top surface of each bump 41.

While the number of the bumps 41 of the bonding part 40 per row is 8, the number of the bumps 71 of the bonding part 70 per row is 21 (21/8 times) in FIG. 3A. Because of this, before the bonding, the total area of the top surface of each bump 41 in the bonding part 40 for bonding the laser light emitting element 20 is substantially the same as the total area of the top surface of each bump 71 in the bonding part 70 for bonding the wavelength conversion element 30 whose planar shape is larger than that of the laser light emitting element 20. Consequently, after the bonding also, the total value of the area of bonding of the bumps 41 is substantially the same as the total value of the area of bonding of the bumps 71.

Because of the above, when mounting the laser light emitting element 20 and the wavelength conversion element 30 on the silicon substrate 10 adjacent to each other, it is possible to set the load applied to the wavelength conversion element 30 as low a load as the load W1 applied to the laser light emitting element 20. Consequently, with the optical device 3 also, various effects are obtained as with the optical device 2 explained by using FIG. 1A.

The planar shape of each bump in the bonding parts 40, 60, and 70 is not limited to the circular shape and may be another shape, such as a square, a rectangle, a polygon, and an ellipse. However, it is desirable that the arrangement of each bump be as uniform as possible. In the optical device 2 in FIG. 1A, the total area of the top surface of each of the bumps 41 and 61 is the same, however, the pitch of the bump 61 in the bonding part 60 is made larger than the pitch of the bump 41 in the bonding part 40. Due to this, the total value of the area of bonding of each bump 41 in the bonding part 40 becomes substantially the same as the total value of the area of bonding of each bump 61 in the bonding part 60.

FIG. 3C is a top view of the silicon substrate 10 of an optical device 4.

The external appearance of the optical device 4 is similar to those of the optical device 2 illustrated in FIG. 1A and the optical device 1 illustrated in FIG. 6. The optical device 4 illustrated in FIG. 3C differs from the optical device 2 illustrated in FIG. 1A only in bonding parts 80 for bonding the wavelength conversion element 30 to the silicon substrate 10.

As illustrated in FIG. 3C, it may also be possible to thin bumps 81 irregularly in the bonding part 80 whose planar shape is large so that the total value of the area of boding of each bump 41 in the bonding part 40 is substantially the same as the total value of the area of bonding of each bump 81 in the bonding part 80.

It may also be possible to make the density of the bumps per unit area differ between each bonding part in accordance with the size of the planar shape of the corresponding optical part, by making the bump pitch differ, by irregularly thinning bumps, or by making the area of the top surfaces of the bumps differ as illustrated in FIG. 1B, FIG. 3B, and FIG. 3C. The "density of the bumps" refers to the ratio of the area of a bonding part to the total area of the top surfaces of the bumps in the bonding part. Further, it may also be possible to make the density of the bumps per unit area differ between each bonding part by combining making the bump pitch differ, irregularly thinning bumps, and making the area of the top surfaces of the bumps differ.

It may also be possible to provide a bonding part with a micro bump structure on the undersurface of each optical part and to form a metal film, such as a Au film on the top surface of the substrate.

The substrate on which optical parts are mounted is not limited to the silicon substrate and for example, may be an aluminum nitride (AlN) substrate, a glass epoxy substrate, etc. The optical parts to be mounted are not limited to the laser light emitting element and the wavelength conversion element and may be any optical parts whose planar shape sizes are different from each other and which can be coupled optically. The number of optical parts to be mounted may be three or more. For example, it is also possible to apply the present invention to the case where a sub substrate is bonded to and mounted onto a main substrate together with a laser light emitting element, a wavelength conversion element, etc., after an optical fiber is fixed onto the sub substrate.

In the above, the example is explained in which a plurality of optical parts is mounted on the same plane of the substrate. However, there is a case where the center adjustment in the Z direction is facilitated if differences in level are provided on the top surface of the substrate and each optical part is mounted on each plane having the difference in level depending on the mutual shapes or structures of the optical parts to be coupled optically.

It is desirable to use gold (Au) for the metal material from which bumps, etc., of each bonding part on the substrate are formed, and for the metal film formed in the position in opposition to the boding part of the undersurface of each optical part. However, as the metal material and the metal film, another metal may be used as long as it is a metal capable of surface activated bonding. For example, copper (Cu), etc., may be used.

The preceding description has been presented only to illustrate and describe exemplary embodiments of the present optical device. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

It is possible to utilize the optical device (optical module) according to the present invention widely in a variety of fields of, such as laser projectors, illuminators using laser light, high-density storage devices, and optical tweezers.

What is claimed is:

1. An optical device comprising:
a substrate;
a plurality of optical parts different in planar shape size, bonded to the substrate by surface activated bonding adjacent to one another, and optically coupled with one another; and
a plurality of bonding parts provided on the substrate in correspondence to the plurality of optical parts and including metallic micro bumps for bonding each optical part,
wherein the total area of the top surfaces of the micro bumps to be bonded to the corresponding optical part of each of the plurality of bonding parts is substantially the same.

2. The optical device according to claim 1, wherein each of the plurality of bonding parts differs in density of the micro bumps in accordance with the size of the planar shape of the corresponding optical part.

3. The optical device according to claim 2, wherein each of the plurality of boding parts has substantially the same area of the top surface of each micro bump and differs in the pitch of the micro bumps.

4. The optical device according to claim 2, wherein each of the plurality of boding parts has substantially the same pitch of the micro bumps and differs in the area of the top surface of each micro bump.

5. The optical device according to claim 1, wherein the plurality of optical parts is mounted on the same plane of the substrate.

6. The optical device according to claim 1, wherein the plurality of optical parts is a laser light emitting element and a wavelength conversion element.

\* \* \* \* \*